United States Patent [19]
Barrett et al.

[11] Patent Number: 5,520,769
[45] Date of Patent: May 28, 1996

[54] METHOD FOR MEASURING CONCENTRATION OF DOPANT WITHIN A SEMICONDUCTOR SUBSTRATE

[75] Inventors: Michael C. Barrett; Chih-Kang Shih; Donald A. Tiffin; Ying Li; Michael J. Dennis, all of Austin, Tex.

[73] Assignee: Advanced Micro Devices, Inc., Sunnyvale, Calif.

[21] Appl. No.: 350,962

[22] Filed: Dec. 7, 1994

[51] Int. Cl.$^6$ .......................... H01L 21/00; C03C 15/00
[52] U.S. Cl. .................... 156/626.1; 156/628.1; 156/645.1; 156/651.1; 156/657.1; 437/8; 437/238
[58] Field of Search .................. 156/626.1, 628.1, 156/636.1, 651.1, 657.1, 645.1; 437/8, 238; 216/59, 62, 84, 87

[56] References Cited

U.S. PATENT DOCUMENTS

| | | | |
|---|---|---|---|
| 5,032,786 | 7/1991 | Kimura | 437/8 X |
| 5,185,273 | 2/1993 | Jasper | 437/8 |
| 5,256,577 | 10/1993 | Bluntke et al. | 437/8 |
| 5,403,753 | 4/1995 | Huber et al. | 437/8 |

*Primary Examiner*—William Powell
*Attorney, Agent, or Firm*—Kevin L. Daffer

[57] ABSTRACT

A method is provided for measuring at resolutions which are in some instances less than 20 nanometers the concentration densities within one or more diffusion regions within a semiconductor substrate. The diffusion regions are prepared for measurement by cleaving a cross-sectional surface and polishing that surface to a substantially flat, exposed surface. The profile is purposefully pre-etched to remove oxide abutting the implant area and thereafter dopant-selective etched in accordance with concentration densities within the substrate. Pre-etching of oxide and concentration density etching of doped silicon provides an exposed topological contour measurable by atomic force microscopy (AFM). AFM can detect the entire cross-sectional surface including conductors and dielectrics. The topological height of impurity region profiles of a calibration wafer are correlated to impurity concentrations to form a calibration curve. The calibration curve, in conjunction with topological contour of a target region profile, allows direct and quick measurement of concentration densities along the target region profile at each AFM scan location. The initial scan position is purposefully defined by an oxide pre-etch step to present an easily discernible AFM-read gradient which signals an initial AFM read position.

20 Claims, 5 Drawing Sheets

METHOD FOR MEASURING CONCENTRATION OF DOPANT WITHIN A SEMICONDUCTOR SUBSTRATE

BACKGROUND OF THE INVENTION

1. Field of the Invention

This invention relates to integrated circuit manufacture and more particularly to a method for measuring dopant profile characteristics within a semiconductor substrate.

2. Description of the Relevant Art

Manufacture of an integrated circuit begins by diffusing or implanting with impurity ions one or more isolated regions across a semiconductor substrate. When activated through temperature anneal, the implanted regions become conductive. Deposited on the upper surface of one or more conductive regions is a plurality of interconnect conductors. The implanted regions and overlying interconnect form a monolithic integrated circuit well known in the art.

Modern integrated circuits employ densely patterned electronic devices patterned across the semiconductor substrate. Each device is quite small and, in some instances, is less than only a few square microns in area. Smaller devices dictate small dopant regions closely spaced across a majority if not the entire wafer. The dopant regions can be formed in any type of semiconductor substrate including, for example, silicon and gallium arsenide. The dopant regions are formed using either n-type or p-type impurities such as, for example, boron, phosphorus, arsenic, antimony, boron fluoride, etc. The dopant regions are formed by actively injecting or passively diffusing a desired impurity into one surface of the substrate. Modern fabrication techniques generally use an ion implanter for actively injecting impurities into the dopant regions. Medium to high energy implanters can easily implant the impurities through a thin oxide naturally formed or purposefully placed on the substrate upper surface. If the substrate is silicon, then a native oxide occurs when the substrate surface is exposed to oxygen. In many instances, the substrate surface is purposefully allowed to grow a thin gate oxide in addition to or in lieu of native oxide.

The electronic devices formed on the substrate surface are generally classified as passive or active devices. An active device generally includes a transistor, whereas a passive device generally includes a capacitor or resistor. Whether active or passive, functionality thereof is determined by many factors. An important factor is the concentration of dopant atoms existing within the dopant regions. To determine resistivity of the dopant regions, turn-on characteristics of a transistor channel between dopant regions, parasitic capacitance at the junction between dopant regions and substrate, susceptibility of hot carrier injection from dopant regions, as well as other characteristics, it is necessary to measure concentration of dopant/impurity atoms in the dopant regions. Periodic measurement of the dopant regions allows engineers and scientists to predict operability of the ensuing device.

There are numerous ways in which to characterize the dopant region. One way is to profile a cross-section of the wafer severed along the dopant region to expose that region extending from a point just below the surface oxide a distance toward the wafer backside surface. The dopant region profile (referenced hereinafter as "dopant region") therefore has an exposed cross-section surface extending perpendicular (i.e., vertically into the substrate from the oxide) and lateral (i.e., horizontally) to the oxide. Measuring dopant concentration, therefore, begins by measuring concentration in two dimensions along both the vertical and lateral directions.

Determination of two dimensional impurity concentration along the dopant region has evolved over the years. Early measurement techniques generally measure resistance and convert each resistance reading to a concentration amount. Resistance-to-concentration conversion requires well known spreading resistance probe (SRP) measurement and conversion techniques. SRP uses a pair of probes brought in contact with the surface of the dopant region. A voltage of several millivolts is applied across the probes and a resulting current is measured. A resistivity of the contacted dopant region can then be measured and related to concentration as a function of carrier mobility. While SRP techniques provide beneficial readings of dopant concentration levels at the surface of the dopant region, SRP techniques suffer many disadvantages. Firstly, SRP probes can only measure in a single dimension between probes the spreading resistance at the surface of the dopant profile. Secondly, and more importantly, failure of SRP probes to adequately contact the dopant region profile will deleteriously affect resistive readings. Thirdly, SRP measurements are limited by the resolution of the probe tip geometry and, since the probe tip diameter must be large to carry adequate measuring current and voltage, SRP measurements are generally limited to resolutions exceeding several microns.

Another widely used dopant characterization technique is secondary ion mass spectrometry (SIMS). SIMS can directly measure, albeit at low lateral resolutions, the dopant concentration in two dimensions not only at the surface region but as a function of depth. SIMS technique consists of using an ion beam (usually oxygen or cesium) to sputter away layers of the dopant region. The sputtered dopant region produces ions that can then be mass analyzed. Sensitivity of the mass analyzer is limited by interference between desired ions and ion complexes. This problem is particularly acute when measuring, for example, $^{31}$P and SiH complexes having somewhat similar atomic mass. A more important limitation of SIMS measurement is lack of resolution. SIMS resolution is limited by the diameter of the sputter beam impinging the dopant region. Generally speaking, SIMS sputter beam diameter oftentimes exceed one-half micron (μm) thereby limiting SIMS usefulness to dopant region geometries which are on the order of one micron in lateral and vertical dimension. In order to determine a concentration gradient across a small dopant profile less than, for example, one half micron, a higher resolution measurement technique is needed.

Responsive to the need for higher resolution, many researchers have discovered the interrelation between dopant selective etching and topography profiling. In an article to Takigami, et al., "Measurements of the three-dimensional impurity profile in Si using chemical etching and scanning tunneling microscopy", *Appl. Phys. Lett.* 58 (20), May 20, 1991, researchers have pointed to the advantages of using an etchant whose etch rate depends upon impurity concentration for removing a portion of the dopant region profile. Takigami, et al. describe the importance of cleaving the dopant region to obtain a dopant region profile, etching the profile with a concentration-dependent etchant, and then measuring the resulting upper topography with a scanning tunneling microscope (STM). The etchant is capable of removing the doped substrate with high resolution demarcation, and the STM is capable of measuring the resulting topography also at high resolution.

The principal of STM operation generally comprises an atomically sharp tip brought near enough to the dopant region surface that the vacuum tunneling resistance between the surface and tip is finite and measurable. The tip scans the surface in two dimensions, similar to a raster pattern, while the height is adjusted to maintain a constant tunneling resistance. In order to maintain the constant tunneling resistance, the metal tip is displaced by a feedback voltage read from the tip to various piezo drives connected to move the tip. The piezo drives move the probe tip toward or away from the surface as it is being scanned across the surface to yield a contour map of the surface.

STMs in combination with concentration-dependent etching provide advantages of higher resolution profiling of the etched surface. Once the topography is known, it is then related to an impurity concentration using a known, unetched region under, for example, a protective photoresist layer. The unetched region being used as a calibration surface is generally located on the surface of the wafer and not on the scanned, profile area being measured. Comparison between dissimilar surfaces prepared under dissimilar conditions is an inappropriate way in which to calibrate a test procedure. The problems of using a dissimilar surface as the calibration surface are manyfold. Firstly, use of a photoresist material to protect the calibration surface renders caustic material on the wafer, which in some instances cannot be removed at the to-be-measured, critical cross-section. Secondly, any photoresist left on the calibration surface or the cross-section surface can skew the high resolution STM profile, thereby defeating the purpose of STM.

Related to the problems of preparing a surface in which to calibrate impurity concentration to etch depth of the dopant region, STM simply cannot measure all types of dopant profiles. The dopant region (i.e., dopant profile) generally includes various dielectric and conductive cross-section layers. Dielectric and conductive layers are formed during wafer fabrication on one surface of the wafer on which a cross-section is thereafter exposed for concentration readings. STM, due to the necessity for having two conductors between the tunneling path, can only measure the topography of a conductive surface. The dielectric oxide adjacent the dopant profile cannot be detected by the STM probe. Since tunneling current does not exist between the probe and the oxide, the probe can inadvertently contact the dielectric and possibly break upon contact. STM is therefore of limited use when measuring a dopant region formed according to normal processing steps having dielectric layers exposed in the profile being measured.

In an effort to overcome limitations of STM, atomic force microscopy (AFM) was discovered capable of measuring topography of both conductors and dielectrics. Raineri, et al., "Carrier distribution in silicon devices by atomic force microscopy on etched surfaces", *App. Phys. Lett.* 64 (3), Jan. 17, 1994. Raineri, et al. describe AFM used to profile a dopant region etched in accordance with dopant concentration. While AFM profiling has numerous advantages, it is nonetheless limited by the calibration technique used.

In essence, a benchmark etch depth must be correlated to an impurity concentration. The benchmark etch depth and corresponding impurity concentration must be formulated from a calibration surface. Given a benchmark etch depth and corresponding impurity concentration, any etch depth reading in a to-be-measured (i.e., target) dopant region about the benchmark can then be correlated to an impurity concentration value. To obtain reliable target readings, it is therefore necessary to maintain the integrity of the calibration surface. It is also necessary that the calibration surface be prepared under similar processing constraints as the target surface being measured. Thus, it would be desirable to form a calibration surface having a dopant concentration profile similar to the target concentration profile. If the target and calibration surfaces are not flat and are not prepared under similar processing constraints, then AFM readings on the target region will not calibrate back to an accurate impurity concentration derived from the calibration surface.

Of further importance in calibration is the need for establishing an initial scan reading location consistent on both the calibration and target surfaces. It is desirable that the scanning of both the calibration and target surfaces be initialized at a known location identical with each other. Further, the reading location must be formed such that scanning of the AFM probe and readings therefrom are not compromised by large disparities at the upper surface being scanned. It is therefore essential that a reading location adjoining both the calibration and target dopant profile be properly fashioned to minimize disparity of the upper scanned surface and to maximize measurability with the highest possible detection resolution.

SUMMARY OF THE INVENTION

The problems outlined above are in large part solved by an AFM calibration methodology of the present invention. That is, AFM calibration hereof utilizes a calibration surface prepared in accordance with similar processing constraints as the upper target surface to be measured. The calibration surface is formed from a cleaved calibration wafer fabricated similar to a target wafer to be measured. The target wafer is cleaved and prepared along the cleaved, cross-sectional surface identical with the calibration cleaved surface to present a target dopant region profile on the cross-sectional target wafer. Both the target and calibration dopant regions (i.e., profiles) are etched using a concentration-dependent etchant, and the resulting topography on both regions are measured using an AFM probe. The AFM probe is adapted for measuring the amount of material removed from the calibration region profile at a specific location along that profile—i.e., relative to a known initial read location. The amount of etch removal at each scan location on the calibration region can then be correlated to an impurity concentration by using an SRP probe or SIMS upon a profile of a test structure, wherein the test structure is formed under identical or similar process conditions as the calibration region. Correlation to impurity concentration at that specific location provides a benchmark etch removal amount corresponding to a benchmark impurity concentration. Any change in etch amount about the benchmark etch amount can then be correlated to variations in impurity concentration and presented as a calibration curve derived from the calibration region. The target region profile and AFM readings therefrom can then be correlated, using the calibration curve, to impurity concentrations at any location along the target region— i.e., relative to a known initial read location.

AFM readings on the calibration and target surfaces are consistently maintained therebetween knowing a starting position for the AFM raster scan. In essence, the AFM probe begins valued measurements when an initial read location is detected. The read location of the calibration dopant region and target dopant region are taken from respective profiles at the junction between an oxide and the calibration and target dopant regions. The oxide in both regions is formed using, for example, identical processing steps to ensure the initial read location is identical for scanning of both regions. Once the initial read location is determined, probe scan along the respective profile is always related back to the known read location so as to compare lateral scan distance on the calibration dopant region to lateral scan distance on the target dopant region and vice versa. Absent identical starting positions for the calibration scan and target scan, the operator cannot relate etch depth and impurity concentration at one lateral distance on the calibration surface to etch depth and lateral distance on the target surface necessary to perform true calibration. Of importance to the present outcome, therefore, is not only the accurate calibration of impurity concentration to etch depth, but also accurate presentation of a consistent starting scan location for both the calibration scan and the target scan.

Broadly speaking, the present invention contemplates a method for deriving a concentration density of dopant within a dopant region as a function of etching depth into the dopant region. The method comprises the steps of providing a wafer having an upper surface and an oxide formed thereon, and a dopant region extending from the upper surface to a depth below the upper surface. The wafer is then cleaved perpendicular to the upper surface to expose a cross-section of the oxide and the dopant region. The wafer is next exposed to an oxide etchant and then to a dopant region etchant to remove along the cross-section a portion of the oxide and the dopant region. The dopant region is removed at a rate proportional to a concentration of activated dopant atoms within the dopant region. As defined herein, "activated" dopant atoms are those rendered electrically active by exposing the dopant to temperature cycles associated with anneal. The oxide and the portion of the dopant region abutting the oxide are removed to a topological height disparity, according to one exemplary embodiment, greater than 10 nm and less than 40 nm. A probe of an atomic force microscope is then scanned across the cross-section. The topological height disparity signals to the atomic force microscope the uppermost boundary of the dopant region and thereby presents an initial read location. Concentration of the dopant within the dopant region can then be computed from the read location signaling the uppermost boundary to depths below the uppermost boundary as a function of the amount of dopant region removed by the dopant region etchant.

The present invention further contemplates a method for correlating dopant concentration and etchant depth of a known (calibration) dopant region profile to a to-be-determined (target) dopant region profile. The method includes the steps of preparing a cross-section of a target semiconductor substrate having a target region of dopant formed, according to one embodiment, simultaneous with and at the same concentration as the dopant placed within the calibration semiconductor substrate calibration region. An oxide arranged upon the cross-section of the target semiconductor substrate is removed to a reduced height and thereafter a portion of the target region is removed with an etchant having an etch rate dependent upon the concentration of the dopant within the target region. Partial removal of the target region and the oxide upon the target semiconductor substrate occur simultaneously with and under identical conditions and duration as each of the steps for partially removing calibration region material and oxide abutting the calibration region material formed on the calibration semiconductor substrate. The upper surface of the target region is then measured by scanning a probe from an initial position adjacent the reduced height oxide (i.e., start location) of the target semiconductor substrate to an end location at least partially across the target region while periodically taking readings of the upper topography. A concentration of dopant within the target region is then computed from the calibration curve by correlating an etch amount taken from each reading of the upper topography of the target region with the corresponding read locations on the upper topography of the calibration region.

The present invention still further contemplates a calibration wafer and a target wafer cleaved and polished along a surface which is substantially flat, and is perpendicular to a backside surface of each respective wafer. After cleaving and polishing the calibration and target wafers, a calibration dopant region profile is presented from the calibration wafer which, according to one embodiment, is larger in cross-section than a target dopant region profile of the target wafer. The calibration and target region profiles can have n-type impurities or, conversely, p-type impurities implanted therein. Adjoining the target and calibration dopant region profiles are respective target and calibration oxides. The target and calibration oxides are preferably silicon dioxide, in substantially stoichiometric proportions.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 1A:
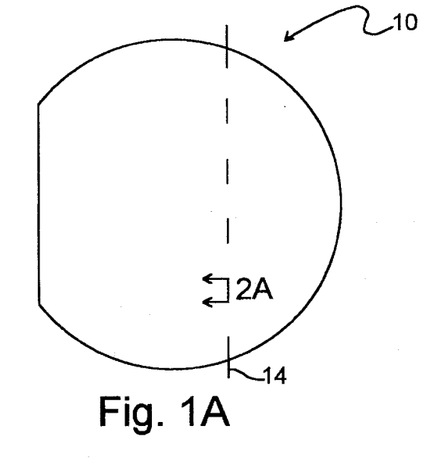
FIGS. 1A and 1B are top plan views of a calibration wafer and a target wafer.
Figure 1B:
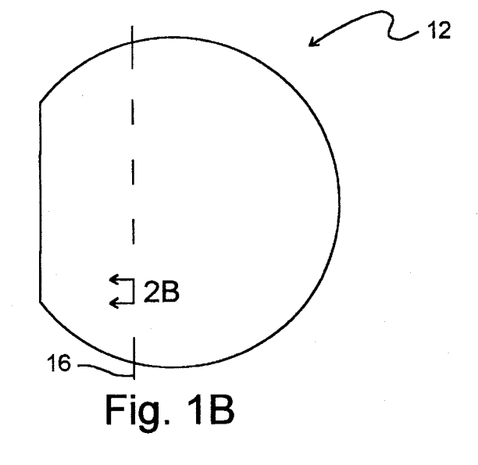

Turning now to FIGS. 1A and 1B, top plan views of calibration wafer 10 and target wafer 12 are shown. Calibration wafer 10 is preferably formed according to the same or similar processing specifications, steps, diffusion densities, temperature cycles, etc. as target wafer 12. In one embodiment, calibration wafer 10 and target wafer r12 can be taken from a dissimilar process run or batch. According to another embodiment, calibration wafer 10 and target wafer 12 are each fabricated in the same process run or batch in order to take on substantially identical device operation characteristics. In yet another alternative embodiment, instead of having two wafers on two dissimilar monolithic substrates, the calibration substrate can be identical with the target substrate, wherein both calibration and target cross-sections are taken from the same wafer. In the latter situation, identical process parameters are guaranteed. In either instance, however, it is merely necessary to present a calibration cross-section similar to a target cross-section, and that each section be substantially flat to allow topological readings therefrom.

If, according to the preferred embodiment, a separate wafer is used as the calibration wafer, then the calibration wafer is cleaved along plane 14. Similarly, target wafer 12 is cleaved along plane 16. Plane 14 as well as plane 16 is chosen perpendicular to the backside surface of respective wafers 10 and 12. Plane 14 and 16 are cleaved using a scribe operation. A diamond-bonded wheel provides a suitable work surface. Additional polishing, if desired, can be done using a frosted glass wheel with water, a mechanical wheel in conjunction with a fluid slurry, or a combination of chemical etching and mechanical abrasion. A popular silicon chemical-mechanical polishing technique employs fine silica powder in a hydroxide solution. An analogous process for gallium arsenide is silica in a sodium hypochlorite solution. Either instance will provide a substantially flat cross-sectional surface, a portion of which is shown in FIGS. 2A and 2B.

Figure 2A:
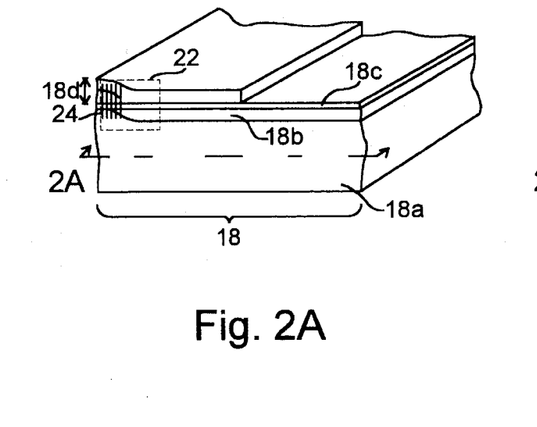
FIGS. 2A and 2B are cross-sectional views along planes 2A and 2B, respectively, of FIGS. 1A and 1B.
Figure 2B:
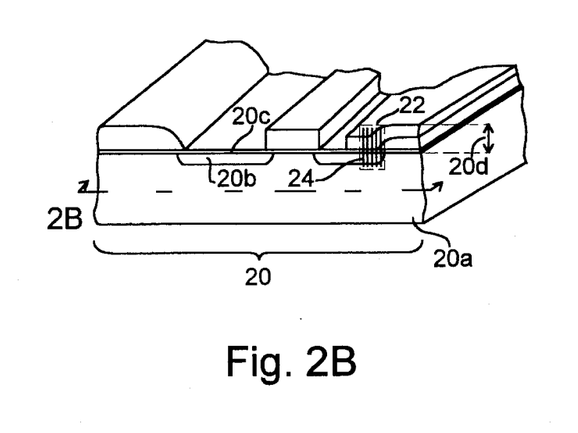

Referring now to FIGS. 2A and 2B, a portion of the cross-sectional surfaces taken from wafers 10 and 12 of FIGS. 1A and 1B, respectively, are shown. FIGS. 2A and 2B illustrate cross-sectional or "profile" surfaces 18 and 20, respectively. Cross-sectional surface 18 is denoted as the profile of calibration wafer 10, and cross-sectional surface 20 is denoted as the profile of target wafer 12. Surface 18 thereby includes cross-sectional surfaces of a calibration semiconductor substrate 18a and a calibration region 18b. Calibration region 18b is diffused or implanted into the upper surface of calibration substrate 18a according to common techniques. Calibration region 18b can be implanted, and generally is implanted, through a thin dielectric 18c placed on the upper surface of calibration substrate 18a. Dielectric 18c is preferably an oxide grown to a depth generally less than 500 Angstroms and is suitable as a gate oxide. Placed on the upper surface of calibration oxide 18c are various levels of metallization 18d. Calibration metallization can extend as vias through oxide 18c via windows or contacts directly to underlying calibration region 18b.

Similar to cross-sectional surface 18, cross-sectional surface 20 is a profile surface along plane 2B of FIG. 1B. Surface 20 includes surfaces formed from target semiconductor substrate 20a, target region 20b and oxide 20c. Various layers and/or levels of metallization as well as dielectrics are placed over target oxide 20c, as shown by reference numeral 20d. Various levels of metallization, with thick dielectric placed therebetween, and contact of metallization conductors to underlying calibration or target regions, 18b or 20b, respectively, complete the fabrication methodology involved in making an integrated circuit. A plurality of integrated circuits are formed across a wafer. In one embodiment, calibration and target regions 18b and 20b, respectively, are taken from a cross-section of a single wafer or, in an alternative embodiment, are taken from two separate wafers manufactured according to identical or somewhat similar process parameters. According to whichever embodiment is chosen, it is important that cross-sectional surfaces or profiles of at least one calibration region 18b and at least one target region 20b are formed.

The need for a profile of respective calibration and target regions 18b and 20b is evident by the methodology in which atomic force microscopy (AFM) is achieved. Topological readings are taken from the profiles of calibration and target regions 18b and 20b. Topological readings are achieved by scanning in a defined region 22 along a raster pattern shown by reference numeral 24. Scanning an AFM probe along pattern 24 allows detection of topological surface variation along cross-sectional surfaces 18 and 20 in defined regions 22. Regions 22 can be of almost any size, limited only by the time duration necessary to achieve AFM. Regions 22 are generally large enough to encompass at least a portion of regions 18b and 20b, respectively. Topological scanning by AFM is further described in reference to FIG. 4. The necessity for AFM scanning and the preparation of calibration and target profiles of surfaces 18 and 20 are described in reference to the steps set forth in FIG. 3.

Figure 3:
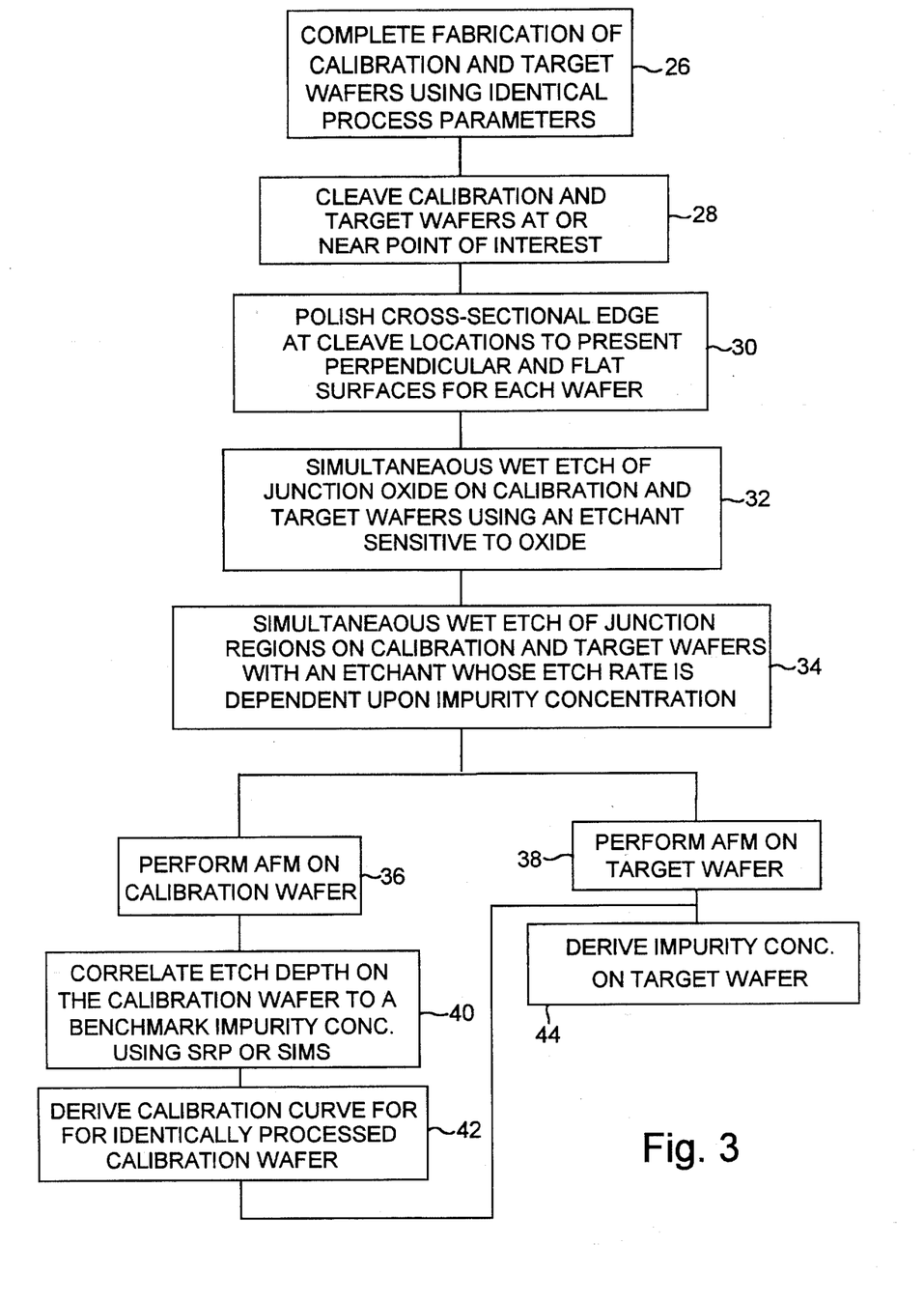
FIG. 3 is a flow diagram of the steps used for deriving a calibration curve from the calibration wafer and for determining from that calibration curve and AFM readings on the target wafer a target wafer dopant concentration profile according to the method of the present invention.

Referring now to FIG. 3, a flow diagram of steps used for deriving a calibration curve from calibration wafer 10 and for determining two-dimensional dopant concentration profile of target region 20b are shown. The methodology begins by completing the fabrication of calibration and target wafers using similar or identical process parameters, according to one embodiment, is set forth in step 26. The calibration and target wafers can then be cleaved at or near the point of interest at step 28. Ideally, calibration and target wafers are cleaved along a cross-section which exposes profiles of calibration region 18b and target regions 20b, respectively. If cleavage does not allow such exposure, then grinding and/or polishing the cross-section can be added to present such a profile. Thus, polishing step 30 may be necessary after cleaving step 28. Even if cleaving step 28 presents an adequate cross-section, polishing step 30 may nonetheless be needed to present a perpendicular surface relative to the wafer backside surface. The perpendicular surface is substantially flat— a important outcome for AFM readings.

Once a flat cross-sectional surface is prepared at step 30, the profile surface must then be etched using an etchant sensitive to oxide. The oxide etchant, a suitable etchant being HF solution, is exposed as a wet etchant to the exposed wafer to etch back calibration oxide 18c as well as target oxide 20c. Oxides 18c and 20c are thereby slightly recessed into the cross-sectional surfaces 18 and 20. Pre-etching of the oxide, and the necessity thereof, is fully explained below in reference to FIG. 5. Oxide etch back is needed to ensure the presence of an initial starting position signaling the beginning of calibration and target region scan readings. The exposed oxide surfaces etched back to a desired depth is necessary to initiate a starting signal on the AFM detector. The exposed oxide surface also reduces AFM tip artifacts allowing tip access to the highly doped region under the oxide. Any suitable etch back amount which achieves that outcome falls within the spirit and scope of the present invention. Subsequent to pre-etch step 32, a dopant concentration selective etch is performed at step 34. A suitable wet etch solution includes 1 ml HF, 40 ml $HNO_3$ and 20 ml $CH_3COOH$. The etch rate of the etchant used in step 34 is dependent upon the impurity concentration of the material being etched. Step 34 etchant thereby attacks and simultaneously removes exposed cross-sectional surfaces 18b and 20b. The etch rate is higher for high concentration regions and lower for low concentration regions. Thus, after step 34, a topological gradient of dissimilar upper surface heights are thereby presented for AFM readings. The differential or changes in height gradient indicates an etch differential and thereby a concentration gradient.

Measuring the resulting topological features subsequent to step 34 is performed using AFM techniques on both calibration wafer and target wafer at steps 36 and 38, respectively. Steps 36 and 38 provide a contour of the topological features, wherein the calibration topological features are read at each scan position and stored in memory. Each test structure associated with calibration region 18b is thereafter probed using SRP techniques to derive a resulting impurity concentration level. The calibration region positions can also be correlated to impurity concentration levels using SIMS techniques. Either SRP or SIMS techniques provide correlation of etch depth at each position of the corresponding test structure to an SRP or SIMS impurity reading. Etch depth readings at each position along the calibration region test structure are SRP or SIMS correlated in step 40 to benchmark impurity concentration readings.

Once the benchmark etch depth and corresponding benchmark impurity concentration is determined from the calibration wafer, a calibration curve is derived for the calibration wafer at step 42. The calibration curve represents etch depth versus concentration densities at various scan positions across calibration region 18b, relative to an initial starting position. The initial starting position is represented as a height differential at the juncture between the calibration/target oxide 18c/20c and the calibration/target region 18b/20b. The topological height gradient at the oxide/dopant region juncture is more variable as a result of the pre-etch step 32 in relation to the impurity concentration sensitive etch step 34.

An important advantage in deriving the calibration curve is the use of a calibration profile surface prepared substantially similar to or identical with the target profile surface to be measured. The target profile is the actual region in which concentration readings are to be taken. The target region 20b can be made much smaller than the calibration region 18b and, in many instances, is smaller than the calibration region. Regardless of the size of calibration region 18b with respect to target region 20b, both calibration and target regions are defined as the profile regions of the respective wafers, and the profile are those profiles cross-sectioned through substrates embodying dopant concentrations. Dopant concentrations include any diffused or implanted region of impurity atoms within a silicon or gallium arsenide substrate.

From the calibration curve obtained from calibration wafer at step 42, and given the AFM readings on target wafer at step 38, the AFM depth readings can be automatically and quickly correlated to impurity concentrations at each AFM-read location on the target wafer, as shown by step 44. Any etch-resultant contour point on target region 20b can therefore be assigned a concentration magnitude by extrapolating etch depth on the target wafer to a corresponding impurity concentration amount taken from the calibration curve.

Figure 4:
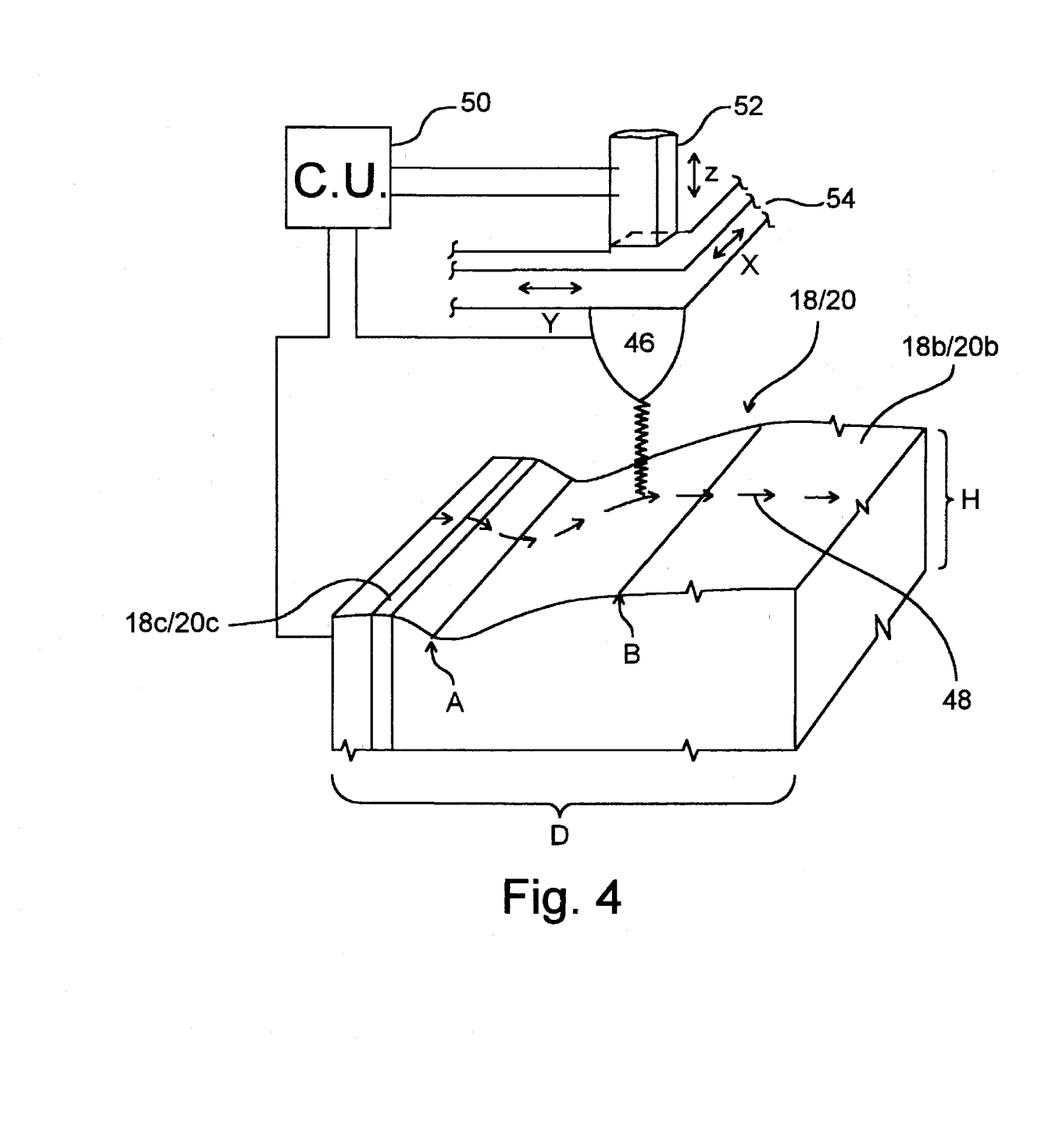
FIG. 4 is a perspective view of target or calibration region profiles undergoing topological AFM scanning according to the present invention.

Details of AFM measurement is best described in reference to FIG. 4. FIG. 4 shows an AFM probe 46 movable in the X, Y and Z dimensions about cross-sectional surfaces 18 or 20. Surfaces 18/20 are oriented upward, as opposed to their horizontal orientation in FIGS. 2A and 2B. Surfaces 18/20 are shown after oxide pre-etch step 32 and concentration-sensitive etch step 34 of FIG. 3. Upper surface 18/20 thereby takes on an upper surface contour proportional to the impurity concentration levels within calibration/target regions 18b/20b. Oxides 18c/20c are also pre-etched to minimize the gradient differential between the upper oxide topography and abutting regions 18b/20b as well to reduce AFM tip artifacts. Fluctuations in height (H) are relative to changes in depth (D). Probe 46 extends in a scan position numerous times across surfaces 18/20 as shown by arrows 48. Arrows 48 indicate a singular scan of raster pattern 24 shown in FIGS. 2A and 2B. AFM readings are taken by raster scanning the two-dimensional upper surfaces 18/20 in the X and Y dimensions. Repulsive or attractive forces between probe 36 and surfaces 18/20 are detected by, for example, deflection of a cantilever (not shown) attached to probe 46 platform. Deflections of the cantilever are sensed using suitable tunneling sensors or optical sensors. The repulsive or attractive forces generally arrive from an AC voltage at probe tip 46, from an externally applied magnetic field, or from adatoms having magnetic moment. A detailed description of atomic force microscopy (AFM) is incorporated herein by reference to Binnig, et al., "Atomic Force Microscope", *Phy. Review Lett.* Vol. 56, No. 9, Mar. 3, 1986. Movement of the cantilever provides resulting movement on probe tip 46 in the Z-dimension controlled by control unit 50. Control unit 50 provides electrical stimulus to a piezoelectric drive unit 52 attached to platform 54 of probe 46.

Figure 5:
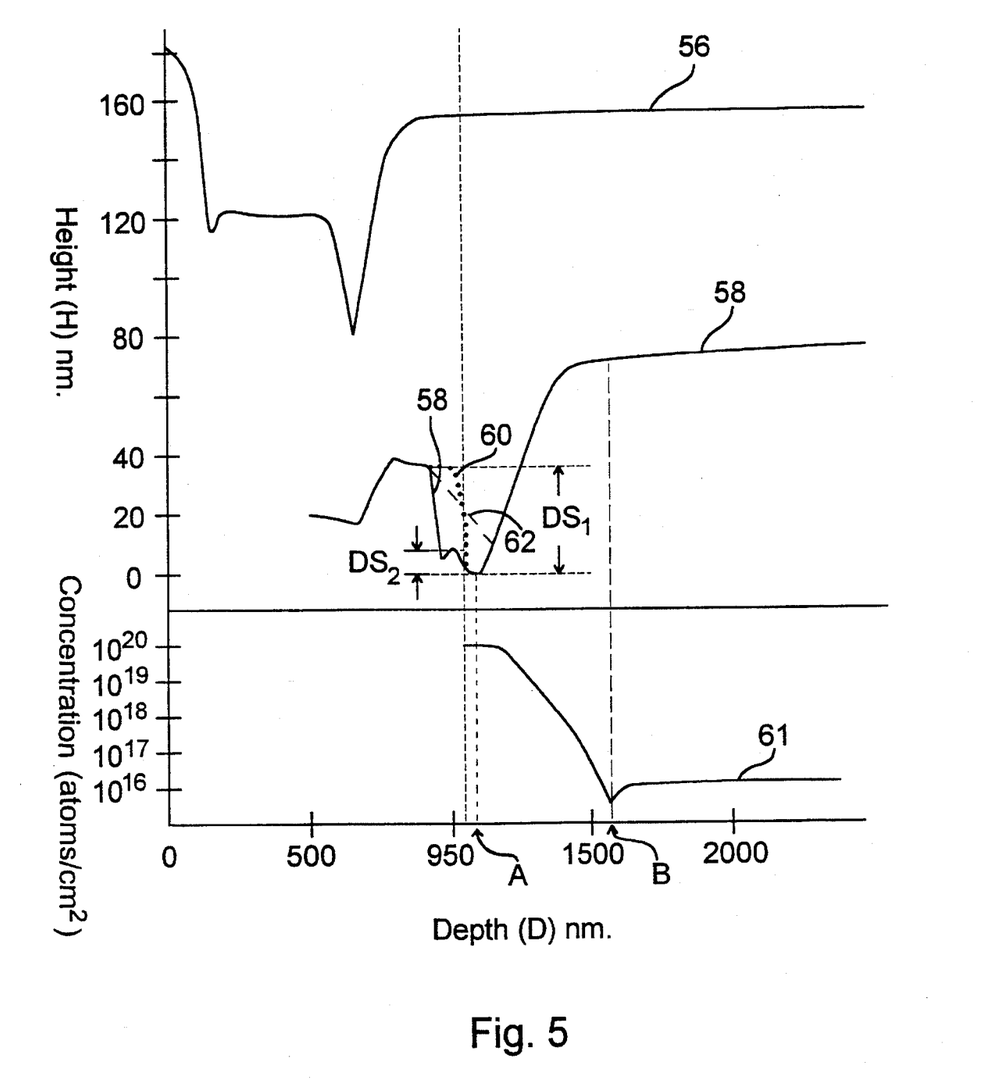
FIG. 5 is a graph showing topological height versus depth of the target or calibration region profiles before and after dielectric pre-etch and dopant-selective etch according to the present invention.

Turning now to FIG. 5 in conjunction with FIG. 4, a graph of topological height (H) versus depth (D) of an actual surface is shown, such as surfaces 18/20 before and after dopant selective etch. Curve 56 represents a profile of the height of surfaces 18/20 before etch steps 32 and 34 of FIG. 3. As noted, curve 56 is relatively flat across regions 18b/20b. After etch steps 32 and 34 are completed, curve 58 is shown. Pre-etch step 32 effects curve 58 by reducing oxide surfaces 18c/20c from curve 60 (shown in dotted line) to curve 58. Reduction in oxide height at pre-etch step 32 provides a noticeable yet lessened disparity $DS_2$ at the oxide/silicon juncture. Topological disparity at the juncture is preferably greater than 10 nm and less than 40 nm. Absent pre-etch step 32, disparity $DS_1$ can be quite large, and is usually greater than 40 nm. Height disparity cannot always be determined by AFM readings since the AFM scan cannot change instantaneously during scan operation. Instead, during large disparity scans, AFM probe 46 might not track the large etch-back region and may, in many instances, track the dashed line shown by reference numeral 62. Tracking along line 62 defeats the purpose of AFM topological detection and concentration sensitive etching. Since concentration sensitive etching is most severe at the surface region or juncture abutting the oxide, large disparities might exist absent pre-etch step 32. Pre-etch step 32 and the adjustment of oxide topography toward abutting silicon topography allows a smaller disparity at the oxide upper surface and at the beginning of calibration/target regions 18b/20b. In addition, pre-etch allows tip access to the highly doped region immediately below the oxide.

FIG. 4 in conjunction with FIG. 5, shows maximum concentration at depth A with monotomicaly decreasing concentration to point B. Scan positions subsequent to point B are relatively flat indicating low doping concentration. The curves 56 and 58 as well as the upper surfaces 18/20 of FIGS. 4 and 5 are taken from AFM readings of calibration or target regions, depending upon the surface being analyzed. FIG. 5 also illustrates curve 61 of concentration as a function of depth. The concentration is maximum at point A and decreases to point B. Concentration curve 62 is derived by SRP readings taken along the test structure corresponding to upper surfaces 18/20 following, for example, the scan pattern of the AFM apparatus. In lieu of SRP, SIMS can be used to determine concentration along the upper topography.

Either technique allows concentration to be plotted as a function of depth. Knowing concentration as a function of depth and height as a function of depth for the scanned upper surface, a calibration profile can be determined. The scanned upper surface and readings therefrom are thereby taken from a calibration surface 18 of a calibration wafer 10. The calibration surface can therefore be analyzed at each height position to provide an etch amount versus concentration density.

Figure 6:
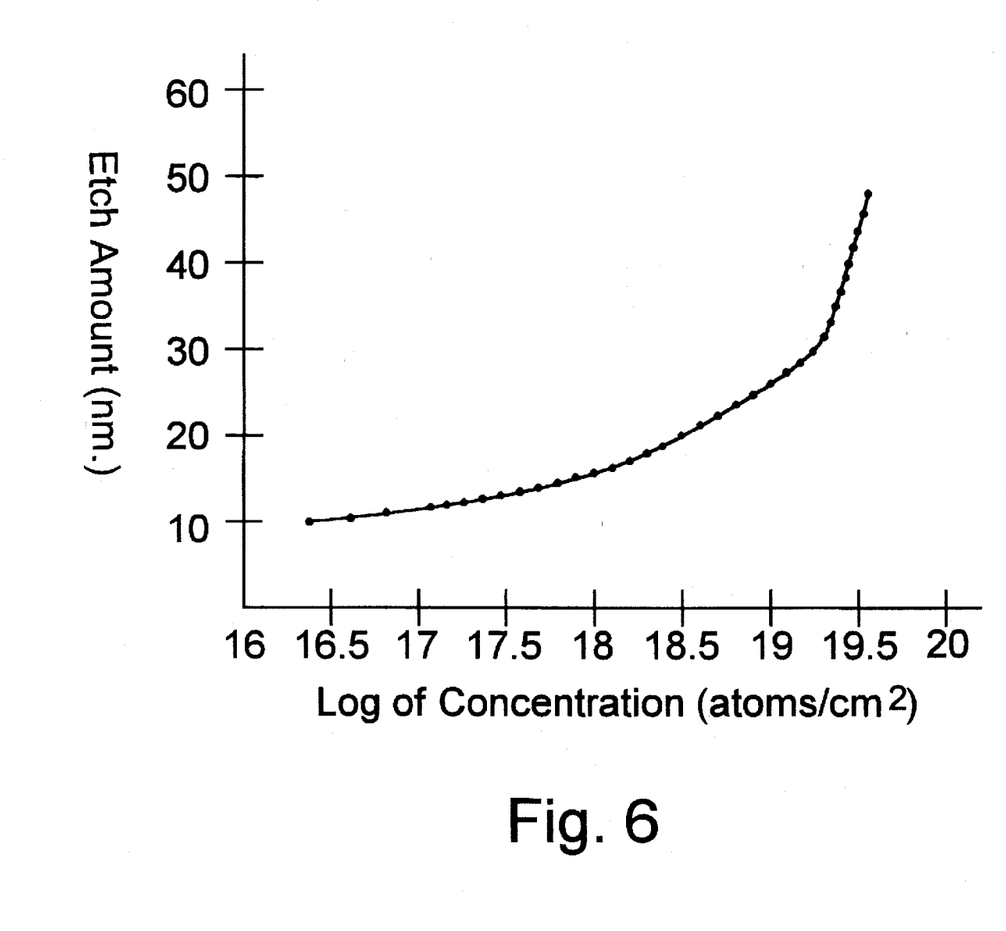
FIG. 6 is a calibration curve derived from the calibration wafer according to the present invention.

FIG. 6 is a plot of concentration density taken as a function of etch amount. Etch amount corresponds to the height differential of plots 56 and 58, and concentration density is taken at each height point as plotted on curve 61. A resulting calibration curve 64 is presented. Curve 64 can therefore be taken from a calibration region 18b beginning at an initial read location signaled by gradient disparity $DS_2$. As shown in reference to FIG. 3, calibration curve 64 provides a benchmark concentration versus etch amount for comparison of subsequent readings on the target region where the target region etch amount can then be correlated to a concentration amount at each scan location relative to the initial disparity gradient AFM signal. Accordingly, the method and procedure hereof is well suited for automatically and quickly deriving an impurity concentration at any location across the target region given a pre-defined calibration curve taken from a similarly processed calibration region.

It will be appreciated to those skilled in the art having the benefit of this disclosure that this invention is believed to be capable of applications with any type of semiconductor substrate having impurity regions implanted or diffused into one surface of the substrate. The impurity regions can be n-type or p-type, and the substrate can be either silicon or gallium arsenide. It is also to be understood that the form of the invention shown and described is to be taken as exemplary, presently preferred embodiments. Calibration region can be taken from the same or from a dissimilar wafer as that used for forming the target region. Thus, the calibration region and target region can be taken from cleaved surfaces of the same monolithic substrate or from dissimilar monolithic substrates preferably fabricated in the same processing batch or run. Various modifications and changes may be made without departing from the spirit and scope of the invention as set forth in the claims. It is intended that the following claims be interpreted to embrace all such modifications and changes.

What is claimed is:

1. A method for determining concentration of a dopant within a target semiconductor substrate, comprising:
   preparing a cross-section of a calibration semiconductor substrate having a calibration region of dopant placed therein;
   etching to a reduced height an oxide arranged upon the cross-section of said calibration semiconductor substrate;
   etching said calibration region with an etchant having an etch rate dependent upon a concentration of dopant atoms within said calibration region;
   measuring the upper surface topography of said calibration region by scanning a probe from an initial position adjacent said reduced height oxide to an ending position at least partially across said calibration region while periodically taking readings of the upper topography of said calibration region; and
   deriving a calibration curve of a concentration of dopant within said calibration region as a function of an etch depth determined from said immediately preceding step.

2. The method as recited in claim 1, further comprising:
   preparing a cross-section of a target semiconductor substrate having a target region of dopant formed at the same concentration as the dopant placed within said calibration region; and
   removing to a reduced height an oxide arranged upon the cross-section of said target semiconductor substrate and thereafter removing a portion of the target region with an etchant having an etch rate dependent upon the concentration of dopant within said target region, wherein partial removal of the target region and the oxide upon the target semiconductor substrate occur simultaneous with and under identical conditions and duration as each of said steps for etching the calibration region and oxide upon the calibration semiconductor substrate.

3. The method as recited in claim 1, further comprising:
   preparing a cross-section of a target semiconductor substrate having a target region of dopant formed with processing parameters similar to those used to form the dopant placed within said calibration region;
   removing to a reduced height an oxide arranged upon the cross-section of said target semiconductor substrate and thereafter removing a portion of the target region with an etchant having an etch rate dependent upon the concentration of said dopant within said target region, wherein partial removal of the target region and the oxide upon the target semiconductor substrate occur simultaneous with and under identical conditions and duration as each of said steps for etching the calibration region and oxide upon the calibration semiconductor substrate;
   measuring the upper surface of the target region by scanning a probe from an initial position adjacent the reduced height oxide of said target semiconductor substrate to an ending position at least partially across the target region while periodically taking readings of the upper topography of the target region resulting from said immediately preceding removing step; and
   computing from said calibration curve a concentration of dopant within said target region by correlating an etch amount taken from each reading of the upper topography of the target region with corresponding readings taken from said calibration curve.

4. The method as recited in claim 1, wherein said preparing step comprises cleaving a calibration wafer to produce an exposed cleaved surface and polishing said exposed cleaved surface to form a substantially flat cross-section of said calibration semiconductor substrate.

5. The method as recited in claim 4, wherein said polishing step comprises placing said exposed cleaved surface on a polishing surface arranged perpendicular to a backside surface of said calibration wafer.

6. The method as recited in claim 3, wherein said preparing step comprises cleaving a target wafer to produce an exposed cleaved surface and polishing said exposed cleaved surface to form a substantially flat cross-section of said calibration semiconductor substrate.

7. The method as recited in claim 6, wherein said polishing step comprises placing said exposed cleaved surface on a polishing surface arranged perpendicular to a backside surface of said calibration wafer.

8. The method as recited in claim 3, wherein the steps of etching and removing said oxide comprises exposing respective said calibration semiconductor substrate and said target semiconductor substrate simultaneously to a wet etchant sensitive to removal of only $SiO_x$ ($1 \leq x \geq 2$) for removing oxide by an identical amount on said calibration and target semiconductor substrates.

9. The method as recited in claim 3, wherein said measuring steps comprise scanning from a reduced height oxide of respective said calibration and target semiconductor substrates to respective abutting said calibration and target regions.

10. The method as recited in claim 1, wherein said deriving step comprising determining concentration of dopant along said test structure of said calibration region at a plurality of locations along said upper surface topography.

11. The method as recited in claim 10, wherein said determining step comprises taking resistive readings along said test structure and relating said resistive readings to concentration of dopant.

12. The method as recited in claim 10, wherein said determining step comprises sputter removing atoms of dopant from said test structure and mass analyzing the quantity of said sputter removed atoms.

13. A method for deriving a concentration density of dopant within a dopant region as a function of etching depth into said dopant region, comprising the steps of:

providing a wafer having an upper surface with an oxide formed thereon and a dopant region extending from said upper surface to a depth below said upper surface;

cleaving said wafer perpendicular to said upper surface to expose a cross-section to said oxide and said dopant region;

exposing said wafer to an oxide etchant and then to a dopant region etchant to remove along said cross-section a portion of the oxide and the dopant region, wherein said dopant region is removed at a rate proportional to a concentration of dopant atoms within said dopant region, and said oxide and a portion of the dopant region abutting said oxide are removed to a topological height disparity greater than 10 nm and less than 40 nm;

scanning a probe of an atomic force microscope across said cross-section, wherein said topological height disparity signals to said atomic force microscope the uppermost boundary of said dopant region; and computing concentration of dopant within said dopant region from said uppermost boundary to depths below said uppermost boundary as a function of the amount of dopant region removed by the exposing step.

14. The method as recited in claim 13, wherein said computing step comprises determining resistivity of said dopant region remaining after said exposing step and relating said resistive readings to concentration of dopant therein.

15. The method as recited in claim 13, wherein said computing step comprises sputter removing atoms of dopant from said dopant region remaining after said exposing step and analyzing the quantity of said sputter removed atoms.

16. A method for deriving a calibration curve of concentration density versus etch depth on a calibration wafer and for relating etch depth on a target wafer to target wafer concentration density:

forming cross-sections through calibration and target wafers having respective calibration and target oxides formed on one surface of said wafers and respective calibration and target doping regions formed directly beneath said calibration and target oxides;

exposing the cross-sections of said calibration and target wafers to identical etchant conditions to remove a portion of the calibration and target oxides separate from the removal of a portion of the calibration and target regions, wherein a measurable upper surface disparity exists between said calibration oxide and said calibration region and well as between said target oxide and said target region, and wherein the calibration and target regions are removed at a rate proportional to a concentration density of dopants therein;

scanning a probe of an atomic force microscope across the cross-sections of said calibration and target wafers to determine respective etch depth;

deriving a calibration curve of concentration density versus etch depth across the cross-section of said calibration wafer; and from etch depth of said target wafer, relating comparable etch depth on said calibration curve to concentration density of said target wafer.

17. The method as recited in claim 16, wherein said calibration region is larger in cross-section than said target region.

18. The method as recited in claim 16, wherein said calibration and target regions have n-type impurities therein.

19. The method as recited in claim 16, wherein said calibration and target regions having p-type impurities therein.

20. The method as recited in claim 16, wherein said measurable upper surface disparity is greater than 10 nm and less than 40 nm.

* * * * *

UNITED STATES PATENT AND TRADEMARK OFFICE
CERTIFICATE OF CORRECTION

PATENT NO. : 5,520,769

DATED : May 28, 1996

INVENTOR(S) : Michael C. Barrett, et al

It is certified that error appears in the above-indentified patent and that said Letters Patent is hereby corrected as shown below:

Claim 8, col. 13, line 1, please delete "$(1 \leq X \geq 2)$" and substitute therefor --$(1 \geq X \leq 2)$--.

Signed and Sealed this

Twentieth Day of August, 1996

Attest:

BRUCE LEHMAN

Attesting Officer     Commissioner of Patents and Trademarks